(12) United States Patent
Freeman et al.

(10) Patent No.: US 10,416,286 B2
(45) Date of Patent: Sep. 17, 2019

(54) IDENTIFICATION AND ANALYSIS OF SOURCE EMISSIONS THROUGH HARMONIC PHASE COMPARISON

(71) Applicant: NOKOMIS, INC., Charleroi, PA (US)

(72) Inventors: Stephen Dorn Freeman, Ellicott City, MD (US); Walter John Keller, III, Bridgeville, PA (US)

(73) Assignee: NOKOMIS, INC, Charleroi, PA (US)

( * ) Notice: Subject to any disclaimer, the term of this patent is extended or adjusted under 35 U.S.C. 154(b) by 788 days.

(21) Appl. No.: 13/967,557

(22) Filed: Aug. 15, 2013

(65) Prior Publication Data

US 2013/0328710 A1 Dec. 12, 2013

Related U.S. Application Data

(63) Continuation of application No. 12/911,072, filed on Oct. 25, 2010, now Pat. No. 8,537,050.

(60) Provisional application No. 61/279,605, filed on Oct. 23, 2009.

(51) Int. Cl.
| | |
|---|---|
| G01S 7/41 | (2006.01) |
| G01S 13/88 | (2006.01) |
| G01R 29/08 | (2006.01) |
| G01S 7/38 | (2006.01) |
| G01V 3/12 | (2006.01) |

(52) U.S. Cl.
CPC ............ *G01S 7/41* (2013.01); *G01R 29/0892* (2013.01); *G01S 7/38* (2013.01); *G01S 13/88* (2013.01); *G01V 3/12* (2013.01)

(58) Field of Classification Search
CPC .. G01S 13/88; G01S 7/41; G01S 7/38; G01V 3/12; G01R 29/0892
See application file for complete search history.

(56) References Cited

U.S. PATENT DOCUMENTS

| | | | |
|---|---|---|---|
| 3,795,911 A | 3/1974 | Hammack | |
| 4,239,388 A | 12/1980 | Green | |
| 4,496,900 A * | 1/1985 | Di Stefano | G01N 27/20 29/593 |
| 5,302,830 A | 4/1994 | Shivanandan | |
| 5,610,705 A | 3/1997 | Brosnan et al. | |
| 5,714,888 A | 2/1998 | Naujoks | |
| 6,057,765 A * | 5/2000 | Jones | G08B 13/2471 340/10.1 |

(Continued)

*Primary Examiner* — Matthew M Barker
(74) *Attorney, Agent, or Firm* — AP Patents (57) ABSTRACT

The present invention is a signal processing method to significantly improve the detection and identification of source emissions. More particularly, the present invention offers a processing method to reduce the false alarm rate of systems which remotely detect and identify the presence of electronic devices through an analysis of a received spectrum the devices' unintended emissions. The invention identifies candidate emission elements and determines their validity based on a frequency and phase association with other emissions present in the received spectrum. The invention compares the measured phase and frequency data of the emissions with a software solution of the theoretically or empirically derived closed-form expression which governs the phase and frequency distribution of the emissions within the source. Verification of this relationship serves to dramatically increase the confidence of the detection.

24 Claims, 5 Drawing Sheets

(56) References Cited

U.S. PATENT DOCUMENTS

| | | | |
|---|---|---|---|
| 6,137,439 A | 10/2000 | Bradford et al. | |
| 6,163,259 A * | 12/2000 | Barsumian | G01S 7/41 |
| | | | 340/551 |
| 6,765,527 B2 * | 7/2004 | Jablonski | G01N 22/00 |
| | | | 342/193 |
| 6,897,777 B2 * | 5/2005 | Holmes | G01V 3/12 |
| | | | 340/551 |
| 6,927,579 B2 | 8/2005 | Blades | |
| 7,464,005 B1 * | 12/2008 | Beetner | G01S 7/021 |
| | | | 342/463 |
| 7,515,094 B2 | 4/2009 | Keller, III | |
| 7,639,178 B1 * | 12/2009 | Mulbrook | G01S 7/35 |
| | | | 342/127 |
| 7,777,671 B2 * | 8/2010 | Schnitzer | G01S 7/292 |
| | | | 342/193 |
| 7,777,672 B2 * | 8/2010 | Schnitzer | G01S 7/282 |
| | | | 342/193 |
| 7,795,596 B2 * | 9/2010 | Chowdhury | G01S 7/41 |
| | | | 250/393 |
| 7,853,437 B2 * | 12/2010 | Seguin | G01S 7/021 |
| | | | 342/463 |
| 7,864,107 B1 * | 1/2011 | Lehtola | G01S 7/41 |
| | | | 342/146 |
| 7,999,723 B2 * | 8/2011 | Jung | G01V 3/12 |
| | | | 340/572.2 |
| 8,063,739 B2 | 11/2011 | Kean | |
| 8,063,813 B1 | 11/2011 | Keller | |
| 2007/0279071 A1 | 12/2007 | Orton | |
| 2010/0123453 A1 | 5/2010 | Pauly et al. | |
| 2010/0289686 A1 * | 11/2010 | Jung | F41H 13/0075 |
| | | | 342/14 |

* cited by examiner

IDENTIFICATION AND ANALYSIS OF SOURCE EMISSIONS THROUGH HARMONIC PHASE COMPARISON

CROSS-REFERENCE TO RELATED APPLICATIONS

This application is a Continuation of U.S. patent application Ser. No. 12/911,072 filed Oct. 25, 2010, pending. This application is also related to and claims priority from US Provisional patent application titled "Identification and Analysis of Source Emissions through Harmonic Phase Comparison" filed on Oct. 23, 2009 with Ser. No. 61/279,605.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention is in the technical field of signal processing. More particularly, the present invention is in the technical field of electromagnetic signal processing. More particularly, the present invention is in the technical field of unintended electromagnetic signal processing for the purposes of detecting, identifying and locating electronic devices.

Any electronic device necessarily emits electromagnetic radiation unintentionally. These emissions are commonly referred to as Electromagnetic Interference in other contexts and are formed by internal device signals which radiate from wires and traces which act as antenna elements. Although weak by communications standards, these radiated signals are unique, consistent and specific to a given device. A sensitive receiver, modern signal processing and a priori knowledge of the device's radiated emissions together provide a mechanism to remotely detect and identify the device. Given a database of electronic device emission structures, it is possible to monitor, detect and identify an assortment of electronic devices.

The ability to detect and identify electronic devices provides useful applications to both military and commercial applications. For example, electronically triggered improvised explosive devices may be detected through the remote reception and analysis of electronic trigger's unintended emissions. This application alone is sufficient to motivate the development of an unintended emissions sensor. However, the growing pervasiveness of electronics in modern society amplifies these interests, offering a rich diversity of applications to which device detection and identification applies, including security, tracking, and surveillance.

A previous patent application Ser. No. 12/422,646 filed Apr. 13, 2009 "ACTIVE IMPROVISED EXPLOSIVE DEVICE (IED) ELECTRONIC SIGNATURE DETECTION" which is herein incorporated by reference, addressed methodologies to amplify and distinguish these unintentional emissions through active stimulation of devices from an illumination source followed by reception of the stimulated emissions. A later patent application Ser. No. 12/551,635 filed Sep. 1, 2009 "ADVANCE MANUFACTURING MONITORING AND DIAGNOSTIC TOOL" which is herein incorporated by reference, addressed the use of unintended emissions to monitor, verify and predict the health of electronics. Another issued U.S. Pat. No. 7,515,094 Issued Apr. 7, 2009 "ADVANCED ELECTROMAGNETIC LOCATION OF ELECTRONIC EQUIPMENT" which is herein incorporated by reference, addresses additional related methods and devices.

However, the ability to detect these emissions and positively associate them with a device in the presence of a noisy electromagnetic background is particularly difficult. Received spectral content which is particular to a device must be distinguished from other received signals. Even when this is achievable, there often remains doubt as to whether the received emissions are in fact related to the targeted device. In particular, it is difficult to identify a device with a low false alarm rate when in the presence of multiple interferers, or when multiple devices are present. Further, it is difficult to dissociate identical devices from one another such that accurate geo-location may be performed.

BRIEF SUMMARY OF THE INVENTION

The present invention provides a mechanism to detect and identify source emissions. More particularly, the present invention is a signal processing method to significantly decrease the false alarm rate of electronic device sensing systems. More particularly, the present invention offers a processing method to reduce the false alarm rate of systems which remotely detect and identify the presence of electronic devices through an analysis of a received spectrum of the devices' unintended emissions. The invention identifies candidate emission elements in a received spectrum and determines their source based on a frequency and phase association with other emissions present in the received spectrum. The invention compares the measured phase and frequency data of the emissions with a software solution of the known theoretically or empirically derived closed-form expression which governs the phase and frequency distribution of the emissions within the source. Verification of this relationship serves to dramatically increase the confidence of the detection.

The present invention is particularly useful when received emissions of interest exist amidst prevalent narrowband background noise. The present invention is further useful in dissociating the emissions from similar electronics when multiple similar devices are within the same region. The present invention can be used to analyze any signal with frequency and phase related content. Examples include, but are not limited to, the radio-frequency spectrum, audio spectrum, X-rays, Terahertz, and ultra-low frequencies.

OBJECTIVES OF THE PRESENT INVENTION

It is therefore one of the primary objects of the invention to provide method and apparatus using phase relationships between harmonics of emitted electromagnetic energy to identify that the harmonics are all related to the same source.

Another object of the invention is to provide method and apparatus to detect electronic devices by the emissions given off by the device whether the emission is intentional or unintentional.

Yet another object of the invention is to provide method and apparatus to identify electronic devices by the emissions given off by the device whether the emission is intentional or unintentional.

A further object of the invention is to provide method and apparatus to locate electronic devices by the emissions given off by the device whether the emission is intentional or unintentional.

Yet a further object of the invention is to provide method and apparatus that determine the instantaneous phase of the underlying source signal so as to identify short term events.

Another object of the invention is to provide method and apparatus to determine the instantaneous phase of the underlying source signal so as to identify electronically triggered events.

Yet another object of the invention is to provide method and apparatus to determine the instantaneous phase of the underlying source signal so as to discriminate moving targets.

A further object of the invention is to provide method and apparatus to determine the instantaneous phase of the underlying source signal so as to discriminate fast events.

Yet a further object of the invention is to provide method and apparatus to determine the instantaneous phase of the underlying source signal to determine the instantaneous phase of the underlying source signal so as to track source emission events.

Still a further object of the invention is to provide method and apparatus to determine the instantaneous phase of the underlying source signal to differentiate harmonic content of a single source from the electro-magnetic background.

Another object of the invention is to provide method and apparatus that use phase relationships between harmonics of emitted electromagnetic energy for remote synchronization.

Yet another object of the invention is to provide method and apparatus that use phase relationships between harmonics of emitted electromagnetic energy for calibrating antenna arrays.

Yet a further object of the invention is to provide method and apparatus that use phase relationships between harmonics of emitted electromagnetic energy for calibrating distributed antenna arrays.

Still a further object of the invention is to provide method and apparatus that use phase relationships between harmonics of emitted electromagnetic energy to improve the timing between elements in an antenna array.

Another object of the invention is to provide method and apparatus that use phase relationships between harmonics of emitted electromagnetic energy for detecting pulsed power events.

Yet another object of the invention is to provide method and apparatus that use phase relationships between harmonics of emitted electromagnetic energy for identifying pulsed power events with a specific source.

Yet a further object of the invention is to provide method and apparatus that use phase relationships between harmonics of emitted electromagnetic energy to perform diagnostics on electronic devices for health monitoring.

Still a further object of the invention is to provide method and apparatus that use phase relationships between harmonics of emitted electromagnetic energy to identify that the harmonics are all related to a specific class of electronic device.

Yet another object of the invention is to provide method and apparatus that use phase relationships between harmonics of emitted electromagnetic energy to identify that the harmonics are all related to a high power electrical device.

Yet a further object of the invention is to provide method and apparatus that use phase relationships between harmonics of emitted electromagnetic energy to identify that the harmonics are all related to a specific electronic device.

Still a further object of the invention is to provide method and apparatus that use phase relationships between harmonics of emitted electromagnetic energy to detect a specific electronic device.

Another object of the invention is to provide method and apparatus that use phase relationships between harmonics of emitted electromagnetic energy to improve the range of detection of electronic devices.

Yet another object of the invention is to provide method and apparatus that use phase relationships between harmonics of emitted electromagnetic energy to improve the confidence of detection of electronic devices.

Yet a further object of the invention is to provide method and apparatus that use phase relationships between harmonics of emitted electromagnetic energy to enhance the ability to diagnose Electromagnetic Interference causes.

Still a further object of the invention is to provide method and apparatus that use phase relationships between harmonics of emitted electromagnetic energy to enhance the Electromagnetic Compatibility of two or more electronic devices.

Another object of the invention is to provide method and apparatus that use phase relationships between harmonics of emitted electromagnetic energy for use in the Radio Frequency range of frequencies.

Yet another object of the invention is to provide method and apparatus that use phase relationships between harmonics of emitted electromagnetic energy for use in the microwave range of frequencies.

Yet a further object of the invention is to provide method and apparatus that use phase relationships between harmonics of emitted electromagnetic energy for use in the millimeter range of frequencies.

Still a further object of the invention is to provide method and apparatus that use phase relationships between harmonics of emitted electromagnetic energy for use in the visible range of frequencies.

Another object of the invention is to provide method and apparatus that use phase relationships between harmonics of emitted electromagnetic energy for use in the Extremely Long Frequency range of frequencies.

Yet another object of the invention is to provide method and apparatus that use phase relationships between harmonics of emitted electromagnetic energy and a receiver with two or more channels.

Yet a further object of the invention is to provide method and apparatus that use phase relationships between harmonics of emitted electromagnetic energy to differentiate between two electronic devices of the same make and model that are different only by the manufacturing lot.

Still a further object of the invention is to provide method and apparatus that use phase relationships between harmonics of emitted electromagnetic energy to differentiate and/or identify electronic components on the same circuit board.

Another object of the invention is to provide method and apparatus that use phase relationships between harmonics of emitted electromagnetic energy for spectroscopy.

Yet another object of the invention is to provide method and apparatus that use phase relationships between harmonics of emitted electromagnetic energy to provide a mechanism for identification of the device that is emitting the electromagnetic energy.

Yet a further object of the invention is to provide method and apparatus that use phase relationships between harmonics of emitted electromagnetic energy to define that the relationship between the harmonics is the frequency spacing between the harmonics.

Still a further object of the invention is to provide method and apparatus that use phase relationships between harmonics of emitted electromagnetic energy where small differences between the relationship between the harmonics is used to identify a specific device.

Another object of the invention is to provide method and apparatus that use phase relationships between harmonics of emitted electromagnetic energy where the spacing between two or more harmonics are analyzed.

Yet another object of the invention is to provide method and apparatus that use phase relationships between harmonics of emitted electromagnetic energy, where higher order harmonics are measured and difference between higher order harmonics is used to measure small changes of the fundamental.

Yet a further object of the invention is to provide method and apparatus that use phase relationships between harmonics of emitted electromagnetic energy where higher order harmonics are used to detect an electronic device when the fundamental or lower order harmonics are not detectable.

Still a further object of the invention is to provide method and apparatus that use harmonics of two fundamental frequencies of emissions that are correlated to provide detection of electronic devices.

Another object of the invention is to provide method and apparatus that use phase relationships between harmonics of emitted electromagnetic energy to facilitate the detection of IEDs.

Yet another object of the invention is to provide method and apparatus that use phase relationships between harmonics of emitted electromagnetic energy, to facilitate the detection of computer equipment.

Yet a further object of the invention is to provide method and apparatus that use phase relationships between harmonics of emitted electromagnetic energy to facilitate the detection of vehicles.

Still a further object of the invention is to provide method and apparatus that use phase relationships between harmonics of emitted electromagnetic energy to facilitate the detection of electronic devices from a vehicle.

Another object of the invention is to provide method and apparatus that use phase relationships between harmonics of emitted electromagnetic energy to facilitate the detection of electronic device from an unmanned vehicle or an aerial unmanned vehicle.

Yet another object of the invention is to provide method and apparatus that use phase relationships between harmonics of emitted electromagnetic energy to facilitate detection of electronic devices from an unmanned aerial vehicle.

Yet a further object of the invention is to provide method and apparatus that use phase relationships between harmonics of emitted electromagnetic energy to facilitate health monitoring of manufacturing equipment.

Still a further object of the invention is to provide method and apparatus that use non-harmonic emissions correlation to detect electronic devices.

Another object of the invention is to provide method and apparatus that use phase relationships between harmonics of emitted electromagnetic energy, enhanced by use of active techniques.

Yet another object of the invention is to provide method and apparatus that use phase relationships between harmonics of emitted electromagnetic energy, enhanced by use of illumination techniques.

Yet a further object of the invention is to provide an electromagnetic emission measurement device comprising: an antenna, a receiver, at least one processor, wherein said electromagnetic emission measurement device is configured to monitor at least one electrical device by measuring at least one electromagnetic emission given off by said at least one electrical device.

Still a further object of the invention is to provide an electromagnetic emission measurement device comprising: an antenna, a receiver, at least one processor, wherein said electromagnetic emission measurement device is configured to monitor at least one electrical device by measuring at least one electromagnetic emission given off by said at least one electrical device and wherein the electromagnetic emission measurement device is configured to use phase relationships between harmonics of emitted electromagnetic energy.

Another object of the invention is to provide an electromagnetic emission measurement device configured to include an analog to digital converter than can be part of the receiver, part of the processor or implemented as a stand alone component.

Yet another object of the invention is to provide an electromagnetic emission measurement device configured to monitor the phase of the harmonics of emissions of an electronic device for monitoring health of such electronic device.

Yet a further object of the invention is to provide an electromagnetic emission measurement device configured to monitor the phase of the harmonics of emissions of an electronic device for at least one of health monitoring, identification, detection, location and geolocaiton of such electronic device.

Still a further object of the invention is to provide an electromagnetic emission measurement device configured to monitor harmonic or non-harmonic content of emissions of an electronic device for at least one of health monitoring, identification, detection, location and geolocation of such electronic device.

Another object of the invention is to provide method and device that use phase relationships between harmonics of emitted electromagnetic energy, wherein the electromagnetic emission measurement device is a multiple channel device configured to monitor the harmonically related phase information of emissions of an electronic device for detection of the electrical device.

Yet another object of the invention is to provide the electromagnetic emission measurement device configured to monitor the RF related phase information of emissions of an electronic device for detection of such electronic device.

Yet a further object of the invention is to provide an electromagnetic emission measurement device configured to monitor at least one of microwave, millimeter, optical, infrared, and LF related phase information of emissions of an electronic device for detection of such electronic device.

Still a further object of the invention is to provide an electromagnetic emission measurement device configured to analyze the related phase information of emissions of an electronic device for detection of such electronic device in a satellite or an aerospace vehicle.

Another object of the invention is to provide method and apparatus that use changes between harmonics of emitted electromagnetic energy to identify that the harmonics are all related to the same source.

Yet another object of the invention is to provide method and apparatus that use phase changes between harmonics of emitted electromagnetic energy to identify that the harmonics are all related to the same source.

Yet a further object of the invention is to provide method and apparatus that use phase consistency between harmonics of emitted electromagnetic energy to identify that the harmonics are all related to the same source.

Still a further object of the invention is to provide method and apparatus that use phase relationships between or related to harmonics of emitted electromagnetic energy to identify that the harmonics are all related to the same source combined with time domain techniques.

Another object of the invention is to provide method and apparatus that use phase relationships between harmonics and time domain techniques of emitted electromagnetic energy to identify that the harmonics are all related to the same source.

A further object of the invention is to provide method and apparatus that use phase relationships and autocorrelation related to harmonics of emitted electromagnetic energy to identify that the harmonics are all related to the same source.

Still a further object of the invention is to provide method and apparatus that measure amplitude and phase relationships and of harmonics simultaneously of emitted electromagnetic energy to identify the source of the emission.

Another object of the invention is to provide method and apparatus that measure and compare amplitude and phase relationships of harmonics simultaneously of emitted electromagnetic energy to identify the source of the emission.

Yet another object of the invention is to provide method and apparatus that measure and compare any combination of amplitude and phase relationships of emission signature harmonics simultaneously of emitted electromagnetic energy to identify the source of the emission.

Yet a further object of the invention is to provide method and apparatus that use measurement of the phase relationships of signatures of emitted electromagnetic energy to identify the source of the emission.

Still a further object of the invention is to provide method and apparatus that use measurement of the phase relationships of signatures of emitted electromagnetic energy to locate, detect and/or geolocate the source of the emission.

Another object of the invention is to provide method and apparatus that use measurement of the phase relationships of signatures of emitted electromagnetic energy to detect or geolocate the source of the emission.

Yet another object of the invention is to provide method and apparatus that use measurement of the phase relationships of signatures of emitted electromagnetic energy combined with Doppler effects on a moving platform to detect the source of the emission.

Yet a further object of the invention is to provide method and apparatus that use phase relationships between harmonics of emitted electromagnetic energy combined with a geospatial overlay to improve visualization of the displayed data.

Still a further object of the invention is to provide method and apparatus that use phase relationships between harmonics of emitted electromagnetic energy to detect computers, cellular telephones or communication devices.

Another object of the invention is to provide a method that uses phase relationships between harmonics of emitted electromagnetic energy and that is configured for use in automated algorithms or analog systems.

DETAILED DESCRIPTION OF THE INVENTION

Figure 1:
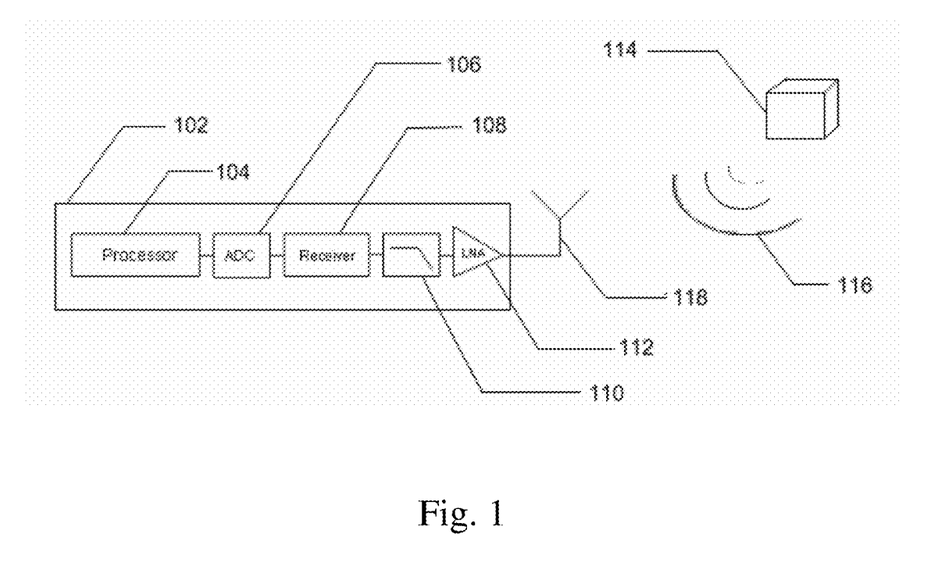
FIG. 1 depicts one embodiment of an unintended emission sensor.

Referring now to the drawings, in FIG. 1 there is shown a specific embodiment of a system 102 for the detection of source emissions, specifically the detection of unintentional emission from electronic devices. The system 102 is used to capture electromagnetic emissions with the intention of identifying the existence of an electronic device 114. The system detects electromagnetic radiation 116 which radiates unintentionally from a device 114. The radiation 116 is detected through use of an antenna 118. The detected radiation is amplified above the background noise through use of a low noise amplifier 112 to generate a received signal. The received signal is then filtered 110 to prevent signal aliasing and reduce the noise bandwidth of the signal. The signal is then received 108 to reveal the in-phase (I) and quadrature (Q) components and digitized through the use of an analog-to-digital converter 106. The digitized output is analyzed with a processor 104 to reveal the phase and magnitude information of the received signal.

Figure 2:
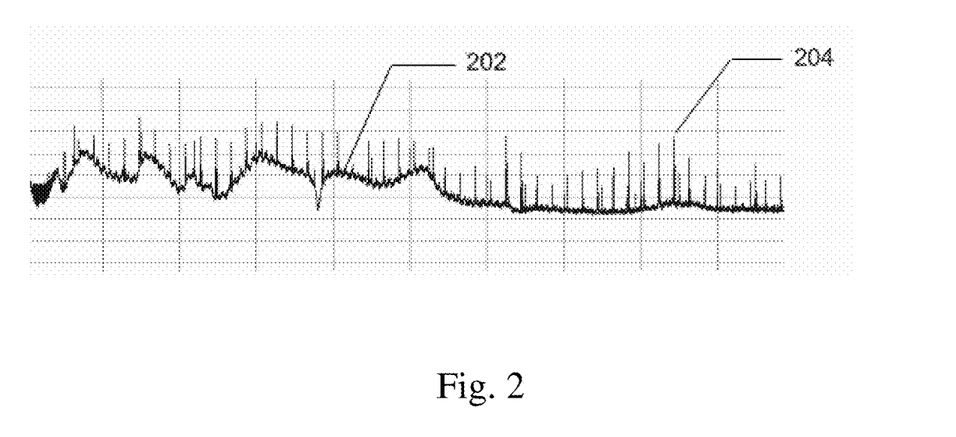
FIG. 2 depicts a received unintended emission pattern.

Referring now to FIG. 2, a typical device emission spectrum 202 is depicted as measured through use of a receiving system 102. The individual device emissions 204 radiate from wires and traces inside of the device. The emissions are typically the distinct components of a complex underlying time-domain signal within the device. The underlying time-domain signal is composed of multiple single-frequency signals. These single-frequency signals are referred to as the Fourier series of the time-domain waveforms and are well known in the art. The system 102 detects a subset of these individual emissions 204 to identify the device.

Figure 3:
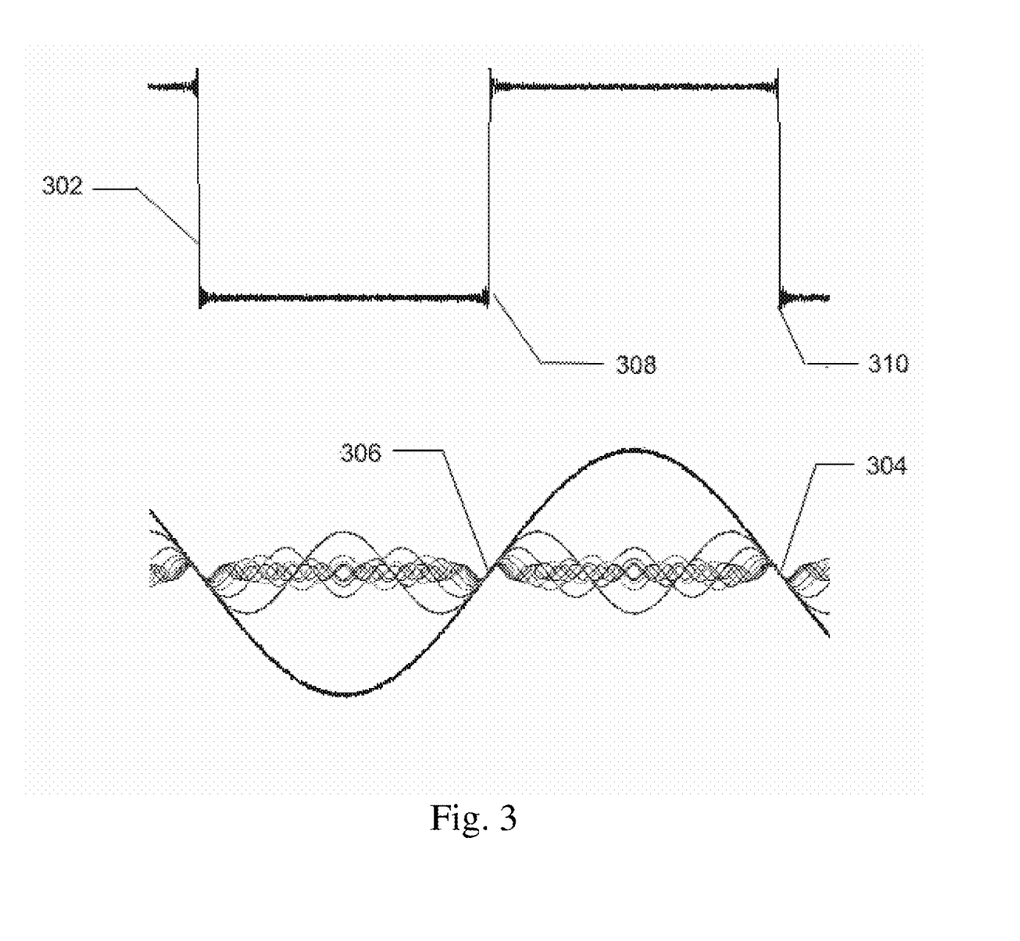
FIG. 3 depicts a square wave and its associated Fourier series components.

Referring now to FIG. 3, a square-wave, which is an example of a common complex time-domain waveform found in electronic devices, is depicted 302 with a periodicity of $1/f_f$. The emission components may be represented mathematically by a Fourier series of the time-domain waveform. The Fourier series of a square wave 302 is composed of sine waves 304 at odd harmonic indices. Each sine wave has an argument which is a function of the harmonic, h, being associated with a harmonic index, k, the fundamental frequency, $f_f$, and the evaluated function time, t., as shown in Equation 1:

$$\sum_{k=1,3,5...}^{\infty} \sin(\Im(k, f_f, t)) = \sum_{k=1,3,5...}^{\infty} \sin(k \cdot 2\pi \cdot f_f \cdot t) \qquad (1)$$

The Fourier series components have phase values which are periodic with the period of the time-domain signal. In Equation 1, the time t=0 is equivalent to the rising edge 308 of the square-wave 302; $t=\frac{1}{2}*f_f$ is equivalent to the falling edge 310 of the square-wave 302; and $t=1/f_f$ is the time of a next rising edge of the square-wave 302. For a square-wave, the Fourier series components each begin with a phase of 0 radians at t=0 306. As t is increased, each Fourier series component cycles through phase values 0 to $2\pi$ for a number of times dependent on the harmonic index, k, until each reaches a phase value of 0 radians at $t=1/f_f$.

An additional example of a device time-domain waveform is the waveform generated in the time-domain by the summation of inter-modulation components within a device. For example, a push-pull LC oscillator is known to produce both a desired frequency, $f_o$, and a series of undesired frequencies at integer multiples. These signals may be viewed as an aggregated complex periodic time-domain waveform and represented by a Fourier series of single-frequency waves. The Fourier series may be constructed through measurement and analysis of the time-domain waveform or through multiple measurements of the single-frequency components. Further, it is clear to anyone skilled in the art that any complex periodic time-domain signal may be represented as a series of sine terms wherein the constituent cosine terms may be expressed as sine terms with a $\pi/2$ phase shift and combined with sine terms of the same frequency.

The relationship of the instantaneous phase and the frequency of each of the waveforms in the series persist as the signals are radiated from the device 114 and propagate through the air 116. The path length from the device to the receiving element is identical for all emissions, even in the cases where the device 114 or the receiving instrument 102 or both are in motion; therefore, if the device emissions are collected simultaneously or at precisely known times relative to one another, the phase and frequency relationship of the emissions is preserved. When collected under these circumstances, all emission components collected will have phase and frequency values related to one another as defined by the Fourier series of the complex time-domain signal within the device.

If a particular component at harmonic $h=h_x$ of the Fourier series of any particular source waveform is detected by a system 102 and the phase is measured as $\theta=\theta_x$, there exist a finite number of time values in a single period of the time-domain waveform at which the particular emission component may take on this measured phase. That is, harmonic $h_x$ will cycle one or more times through phase values of 0 to $2n$ within a single period of the time-domain waveform and, further, harmonic $h_x$ will have an instantaneous phase of precisely $\theta_x$ once during each cycle of the harmonic and therefore one or more times during the source period. However, practical considerations in system resolution and the received signal strength require the addition of an error term, $\delta=\delta_x$, to this phase measurement, effectively creating a range of phase values, $\theta_x \pm \delta_x$, rather than a precise value, $\theta_x$. The error term is derived empirically such that the defined phase range, $\theta_x \pm \delta_x$, contains the true phase value. The times within a single source waveform period at which the harmonic $h_x$ has an instantaneous phase within the phase range $\theta_x \pm \delta_x$ is denoted with vector $t=t_x$. This time vector, t, may be identified through a solution to the following equation:

Find $t$ such that: $|\Im(k,f_f t) \bmod 2\pi) - \theta| < \delta$ (2)

where $\Im(k_1, f_f, t)$ is the argument of the sine terms of the Fourier series expression for the complex time-domain waveform and t is a series of time values, uniformly separated, within the boundaries of $t=0$ and $t=1/f_f$. If a second component at harmonic $h=h_y$ of the Fourier series of this same complex time-domain waveform is detected simultaneously by the system 102 and the phase is measured as $\theta=\theta_x$, with an error of $\pm\delta_y$, the solution of Equation 2 will again yield a finite number of time values, denoted with vector $t_y$, at which this phase may occur in a single period of the time-domain source waveform. The intersection of the values in $t_y$ and $t_x$ yields a reduced vector of time values, $t_{int}$. The time values within the vector $t_{int}$ are the times within a single period of the source time-domain waveform at which harmonics $h_x$ and $h_y$ have an instantaneous phase within the measured phase ranges, $\theta_x \pm \delta_x$ and $\theta_x \pm \delta_x$ respectively. Any additional harmonic, $h_x$, may be further included through measurement and the use of Equation 2 to obtain an additional time vector, $t_z$. This vector, $t_z$, may be intersected with the vector $t_{int}$ to form a new reduced intersection vector of time values, $t_{int}'$.

Interfering emissions which are included in this analysis will often yield an empty set, { }, in the intersection solution, $t_{int}$. An empty set in the intersection implies with high certainty that the received emissions are not all emitted from a source with the modeled Fourier series.

The Fourier series model of a time-domain waveform of a targeted device is further useful to overcome device variations issues. Electronic emissions are known to vary in the fundamental frequencies of their internal time-domain waveforms due to both thermal and manufacturing variations. Any variation in the fundamental frequency of the time-domain signal causes even larger variations in the frequency of the higher-order Fourier series terms. These variations complicate the reception of any given harmonic emission when a system 102 attempts to identify received emissions. The harmonics themselves, however, are related in frequency to one another based on the Fourier series of the time-domain waveform. That is, the frequency values of the harmonics are modified through a change in the fundamental frequency, $f_f$, but the relationship between harmonic frequencies is undisturbed. Therefore, the frequency of any emission element may be identified given the frequency of any other harmonic through:

$$f_b = f_a \cdot \frac{k_b}{k_a} \quad (3)$$

Equation 3 may be applied to any received harmonic to predict the location of additional harmonic emissions. The preferred embodiment of the present invention searches a spectral region to identify a candidate emission element which is preliminarily assigned to be part of a Fourier series emitted from a source. Additional emissions are predicted according to Equation 3 and, if present, the received emissions are verified for association with the source through use of the phase relationships detailed in Equation 2. If the additional harmonics are not present, or the measured phases of the harmonics are not verified with the Fourier series model, the candidate is classified as interference unrelated to the source.

Figure 4:
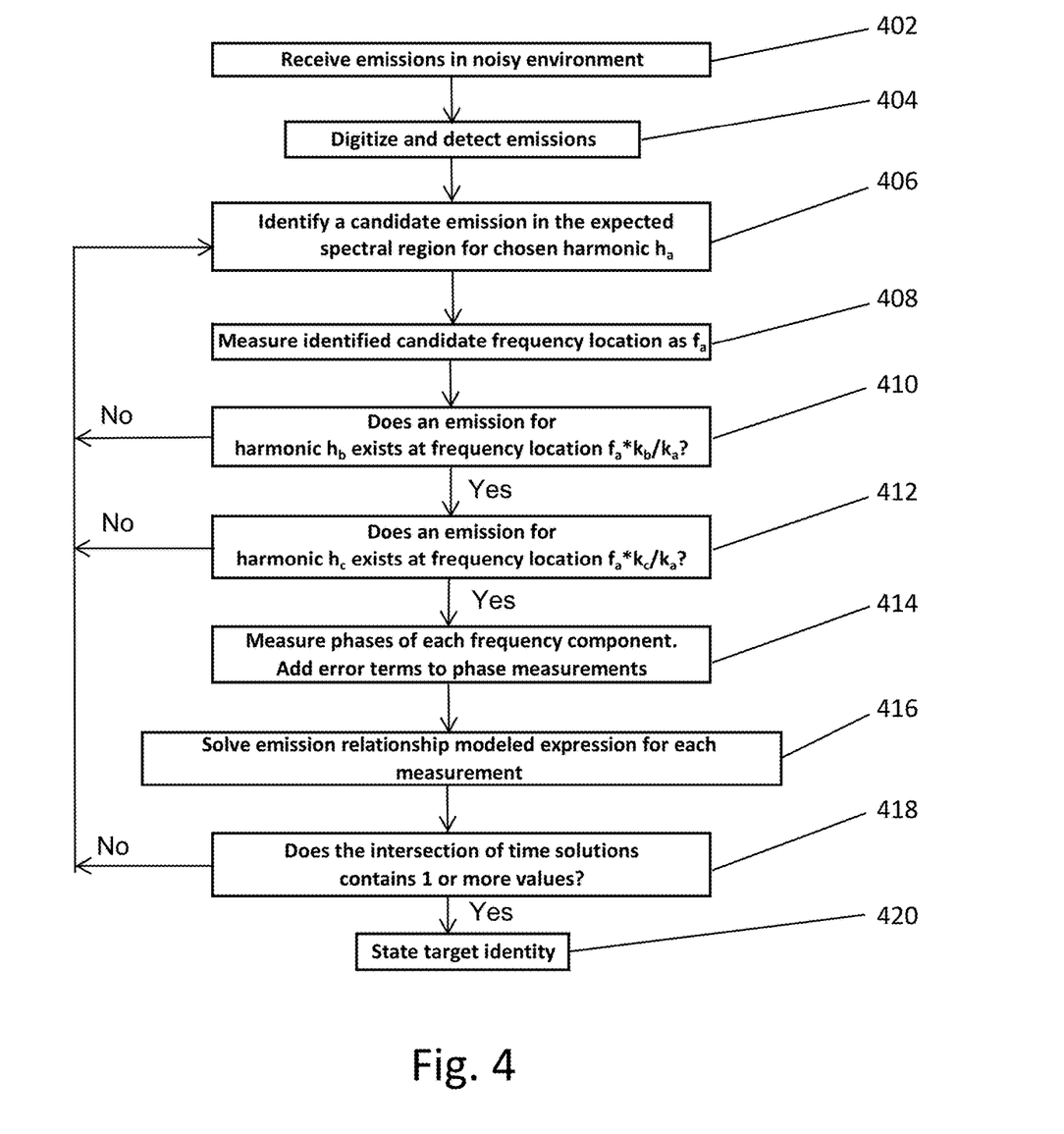
FIG. 4 depicts a flow-chart of the preferred embodiment of the present invention for verifying electronic device presence.

Referring now to the drawing of FIG. 4, a flow-chart of the preferred embodiment of the present invention is given. A particular device with a pre-characterized emission pattern and pre-characterized variation is selected for detection. Emissions are received with a sensor system 102 in an electromagnetically noisy environment 402 and electromagnetic energy is detected, digitized and processed for phase and frequency information 404. A particular spectral region of the received energy which spans the expected emission variation of harmonic $h_a$ of the device is identified 406. A candidate emission, if present, is selected from this region for analysis 406. The frequency of the candidate emission is then taken and recorded to memory as $f_a$ within the system 408.

The frequency location of the candidate emission at $f_a$ is used to determine the precise location of additional harmonic emission elements. Harmonic $h_b$, being associated with a harmonic index $k_b$ is predicted to at frequency $f_b = f_a * k_b / k_a$ 410, while harmonic $h_c$, being associated with a harmonic index $k_c$ is predicted to be at frequency $f_c = f_a * k_c / k_a$ 412. If an emission element is not present within the received spectrum at either frequency $f_b$ or $f_c$, the candidate emission is classified as interference and a different initial candidate emission within the region of interest is chosen 406. The process is repeated until either: all candidate emissions within the region of interest are exhausted, in which case the targeted electronics was not identified; or the two additional harmonics $h_b$ and $h_c$ are identified.

If both of the additional harmonics $h_b$ and $h_c$ do exist in the predicted frequency range centered about frequencies $f_b$ and $f_c$, a measurement of each emission's phase is taken 414. Each phase value is ascribed an error boundary, $\pm \delta$, which effectively changes the phase value to a phase range centered about the measured phase value 414. The error term is defined for the system based on the measurement sensitivity such that the defined phase range will contain the true phase of a measured signal.

A comparison of the phases of the emissions is then made through the following process to significantly reduce the false alarm rate of the system, effectively allowing detection and identification of signals within considerably noisy backgrounds. Each of the phase ranges for harmonics $h_a$, $h_b$, and $h_c$, and their associated measured frequencies, $f_a$, $f_b$, and $f_c$, are applied to the known model of a Fourier series of emissions of the targeted device. The model assumes a single period of the fundamental tone, $1/f_f$ in duration, where $f_f = f_a / k_a$, which begins at $t=0$. A series of time vectors is generated for each emission, $\{t_a, t_b, t_c\}$, as follows:

Find $t_a$ such that: $|(\Im(k_a f_f t_a) \bmod 2\pi) - \theta_a| < \delta_a$

Find $t_b$ such that: $|(\Im(k_b f_f t_b) \bmod 2\pi) - \theta_b| < \delta_b$

Find $t_c$ such that: $|(\Im(k_c f_f t_c) \bmod 2\pi) - \theta_c| < \delta_c$

The vectors $t_a$, $t_b$ and $t_c$ define the times within the source time-domain waveform period, from $t=0$ to $t=1/f_f$, at which the measured emissions at frequencies $f_a$, $f_b$, and $f_c$ may have measured instantaneous phases within the phase ranges of $\theta_a \pm \delta_a$, $\theta_b \pm \delta_b$, and $\theta_c \pm \delta_c$ 416. The intersection of the time vectors $t_a$, $t_b$ and $t_c$ yields a vector $t_{int}$ of times at which the phase ranges of the harmonic emissions may occur simultaneously. If a single time solution, or more than one time solution, exists within $t_{int}$ 418, the measured emissions are consistent with the time-domain waveform of the device and the target is considered identified 420. Positive association of the phases of any harmonic signal with two other harmonic signals implies with high certainty that the analyzed signals are harmonics which originated from a single source, rather than independent signals or noise sources. The decision process 418 is stated as:

If intersection of $\{t_a, t_b, t_c\} \neq$ empty set, the measured harmonics are predicted to have originated from the targeted source device 420.

If intersection of $\{t_a, t_b, t_c\}$ = empty set, the measured harmonics are predicted not to have originated from the targeted source device and a new candidate emission is chosen for analysis from the spectral region of harmonic $h_a$ 406.

Figure 5:
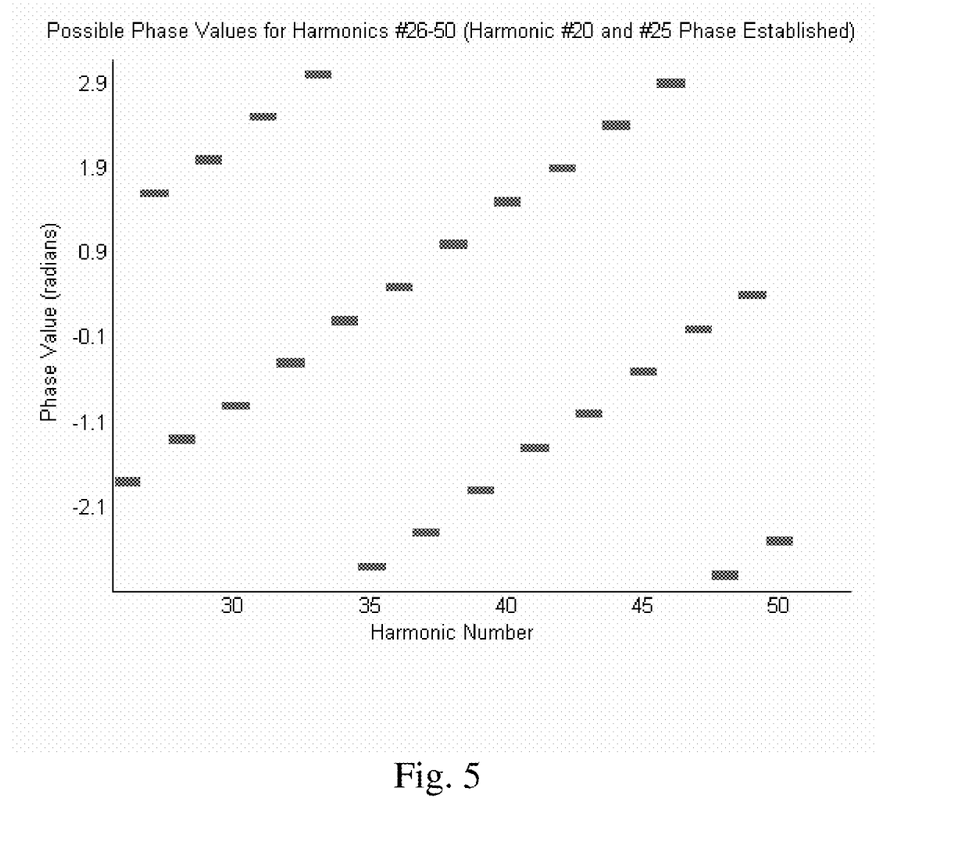
FIG. 5 depicts the results of an analysis with the preferred embodiment of the present invention.

Referring now to FIG. 5, depicted is the results of an analysis of a phase comparison on a 20 MHz square-wave. The 39th harmonic is identified at a frequency of 780 MHz and found to have a phase of 3.0 radians with a measurement uncertainty of 0.05 radians. The 49th harmonic is simultaneously received with the 39th harmonic and found to have a phase of 1.0 radian with a phase uncertainty of 0.05 radians. The intersection of the time solutions to the Fourier series, as described above, is evaluated. All harmonics from the 50th to the 99th are then examined to determine the required phase values at the intersection times for these harmonics to be part of the harmonic series. As shown in FIG. 5, the phase of any third chosen harmonic between k=50 and k=99 will be defined to reside within a narrow phase region. FIG. 5 depicts possible phase values of a third harmonic in white and not-possible phase values in black. Therefore, a third emission measurement at any of these harmonics is required to have a measured phase range within the region defined in FIG. 5 for a positive prediction of association with the targeted source to be made.

The specific embodiment expressed through reference to the flow chart of FIG. 4 is not intended to limit the application of this technique. It is clear to anyone skilled in the art that variations on the above specific embodiment may be applied. For example, although the preferred embodiment for the present invention makes use of three harmonics, the present invention may be applied to only two signals within the spectrum to provide a meaningful verification of the emission relationship or to reject interfering signals. Similarly, the present invention may be applied to more than three harmonics to yield increased confidence and increased precision in the instantaneous phase of the device's time-domain signal. Irrespective of the number of harmonic emissions analyzed in the present invention, the precision of the results of the present invention are dependent on the selection of the harmonic indices for reception. That is, certain choices of received harmonic emissions result in an intersection vector, $t_{int}$, with fewer values than other choices of received harmonic emissions.

A benefit of this processing technique is that with repeated observations of the emissions there is a continued increase in the confidence of the prediction of target presence and identity. Phase relationships are expected to change if the emissions are not in fact related through an underlying time-domain waveform. Therefore, repeated observations and verifications of the phase relationship between received emissions serves to reduce the likelihood that the measured emissions are coincidentally present at the expected frequencies and coincidentally have the appropriate phases needed for association with a targeted device.

Further, it is considered that if the phases of the source emissions are verified through the present invention with three or more harmonics, the instantaneous position within a single period of the target's time-domain signal is determined. For example, the use of three harmonics in the present invention defines a short, contiguous vector of time values, $t_{int}$, which resides within the period of the time-domain waveform from $t=0$ to $t=1/f_f$. If the analyzed source were the unintended emissions of an electronic clock, the transition edges of this clock source may be easily determined, with an error based on the largest and smallest values within $t_{int}$. Tracking the location within the fundamental period of a remote source allows precise remote synchronization between devices allowing, for example, phase timing in widely separated array receivers, or timed analysis of short duration events for which knowledge of the source phase is relevant. This information is further useful in directed energy applications which would benefit from synchronizing the pulses of a directed energy weapon with the target's internal functionality.

An additional benefit of the present invention is that it may be used to mitigate interfering signals while on a moving platform or when receiving from a moving source. The aforementioned phase and frequency relationships between received harmonics will be maintained independent of any motion induced Doppler shifting. In addition, interfering signals will vary in phase differently when they are not geometrically co-located with the source of interest. Therefore, relative Doppler shifting of the harmonics and interferers, which is apparent in a frequency and phase analysis of the receive emissions, allows for the discrimination between sources with higher accuracy than available from a static separation. When the interfering signals are from a similar device, the Doppler effect from the relative motion serves to improve differentiation between the two devices.

Moreover, the present invention may be used to improve the geolocation of detected electronics by providing a improved resolution of the received phase of the source emissions through the analysis of their mutual relation.

An additional benefit of the present invention is that the received emission elements may be considerably higher frequency (harmonic index>>1) than the fundamental harmonic of the source for operation. Any harmonic signals of the emission pattern which may be received by the sensing system may be used by the present invention. A benefit of this ability of the invention is that it allows for the verification of the device presence through only the narrowband reception of a few emissions in any particular frequency range, often desirable due to limitations in antenna size and performance in a sensing system.

In a broad embodiment, the present invention is a method to identify an emission source through an analysis of the relation of the phase and frequency of a subset of the received emissions with a model of the Fourier series of the emission waveform. The invention may be applied to any emission content which is composed of a pattern of frequencies with related phases, including without limitation the emissions of x-rays, terahertz waves, millimeter waves, radio waves, microwaves, optical waves, infrared waves, low frequency waves, and sonic waves.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

I claim:

1. A method of determining a targeted electronic or electrical device as a source or a non-source of emission of electromagnetic energy, said method comprising the steps of:
    receiving, with a receiver, coupled to an antenna, emissions of electromagnetic energy;
    digitizing, with an analog-to-digital converter, an output signal from said receiver into a digitized signal;
    selecting, with a processor, a spectral region of said received electromagnetic energy that spans an expected emission variation of a harmonic of said targeted electronic or electrical device, said harmonic being associated with a frequency location and a harmonic index;
    selecting, with a processor, a candidate emission from said emissions of electromagnetic energy for said harmonic;
    determining, with said processor, based on said frequency location, an existence of one or more additional harmonics;
    identifying, with said processor, a phase and a frequency relationship between said harmonic and said one or more additional harmonics;
    generating, with said processor, a time vector for each of said harmonic and said one or more additional harmonics based on phase values for said one or more additional harmonics;
    identifying an existence or an absence of at least a single value in an intersection vector of all time vectors; and
    determining, with said processor based on said existence or said absence of said single value, said targeted electronic or electrical device as said source or said non-source of said emission of electromagnetic energy.

2. The method of claim 1, wherein the step of identifying said phase and frequency relationship includes a step of comparing harmonic spacing in frequency of said electromagnetic energy emission.

3. The method of claim 1, wherein the step of identifying said phase and frequency relationship includes a step of one of measuring, comparing and a combination thereof, one of amplitude, phase, and a combination thereof between said at least two harmonics of said electromagnetic energy emission.

4. The method of claim 1, wherein the step of identifying said phase and frequency relationship between said harmonic and said one or more additional harmonics of said electromagnetic energy emission comprises a step of revealing a phase and magnitude of said electromagnetic energy emission.

5. The method of claim 1, wherein the step of identifying said phase and frequency relationship between said harmonic and said one or more additional harmonics of said electromagnetic energy emission comprises a step of using Fourier series of a time-domain waveform.

6. The method of claim 1, wherein the step of identifying said phase and frequency relationship between said harmonic and said one or more additional harmonics of said electromagnetic energy emission comprises a step of generating a range of phase values.

7. The method of claim 6, further including a step of identifying, with a time vector, a condition wherein a harmonic has an instantaneous phase within said range of phase values.

8. The method of claim 1, wherein the step of identifying said phase and frequency relationship between said harmonic and said one or more additional harmonics of said electromagnetic energy emission includes a step of predicting a location of additional harmonics.

9. The method of claim 1, further including a step of identifying interference unrelated to said source of said electromagnetic energy emission.

10. The method of claim 1, wherein the step of receiving said emission of electromagnetic energy includes a step of receiving at least two emissions of electromagnetic energy, a step of using a multi-channel receiver and a step of collecting said at least two electromagnetic energy emissions simultaneously at all applicable channels.

11. The method of claim 10, further including a step of identifying phase and frequency values of components of said at least two electromagnetic energy emissions prior to the step of identifying said at least one phase and frequency relationship between said harmonic and said one or more additional harmonics of said electromagnetic energy emissions.

12. The method of claim 1, further comprising locating or geolocating said electronic or electrical device.

13. The method of claim 1, further comprising determining an instantaneous phase of an underlying source signal to identify at least one short term event.

14. The method of claim 1, further comprising differentiating harmonic content of said source from electro-magnetic background noise.

15. The method of claim 1, further comprising detecting at least one electronically triggered event.

16. The method of claim 1, further comprising monitoring, verifying or predicting a health of one of said electronic device, an electrical component, and a combination thereof.

17. The method of claim 1, further comprising identifying that a set of harmonics is being related to a specific class of said electronic or electrical device.

18. The method of claim 1, further comprising identifying that a set of harmonics is being related to a specific electronic or electrical device.

19. The method of claim 1, wherein said emission of electromagnetic energy is an unintended emission.

20. The method of claim 1, wherein said target electronic or electrical device comprises a pre-characterized emission pattern and pre-characterized variation.

21. The method of claim 1, comprising amplifying, using a low noise amplifier, said emission of electromagnetic energy received with said receiver.

22. A method of determining a targeted device with a pre-characterized emission pattern and pre-characterized variation as a source or a non-source of emissions of electromagnetic energy, said method comprising:
   receiving, with a sensor, emissions of electromagnetic energy in an electromagnetically noisy environment;
   digitizing, with an analog-to digital converter (ADC), an output signal from said receiver into a digitized signal; and
   processing said digitized signal with a processor to:
      reveal a phase and a magnitude information;
      identify a spectral region of said received electromagnetic energy that spans an expected emission of a harmonic $h_a$ of said targeted device, said harmonic $h_a$ being associated with a harmonic index $k_a$;
      select a candidate emission in said spectral region for said harmonic $h_a$;
      measure a frequency location of said candidate emission;
      record, in a memory, said frequency location of said candidate emission as $f_a$;
      determine, based on said frequency location $f_a$, an existence of a harmonic $h_b$, being associated with a harmonic index $k_b$, at a frequency location $f_b = f_a * k_b / k_a$;
      determine, based on said frequency location $f_a$ and said existence of said harmonic $h_b$, an existence of a harmonic $h_c$, being associated with a harmonic index $k_c$, at a frequency location $f_c = f_a * k_c / k_a$;
      measure phase values of each of said harmonic $h_b$ and said harmonic $h_c$;
      convert, by adding an error term, each phase value into a phase range;
      generate, using a Fourier series, a time vector for each harmonic $h_a$, $h_b$, and $h_c$ as $t_a$, $t_b$, and $t_c$ respectively;
      determine an existence or an absence of at least a single value in an intersection vector $t_{int}$ of times $t_a$, $t_b$, and $t_c$ at which phase ranges of harmonics $h_a$, $h_b$, and $h_c$ occur simultaneously; and
      identify said targeted device as said source of said emissions of electromagnetic energy upon existence of said at least single value in said intersection vector $t_{int}$ or as said non-source of said of said emissions of electromagnetic energy upon absence of said at least single value in said intersection vector $t_{int}$.

23. The method of claim 22, comprising repeating steps of selecting said candidate emission in said spectral region for said harmonic $h_a$; measuring said frequency location of said candidate emission; and recording, in said memory, said frequency location of said candidate emission as $f_a$; if said existence of said harmonic $h_b$ is not determined.

24. The method of claim 22, comprising repeating steps of selecting said candidate emission in said spectral region for said harmonic $h_a$; measuring said frequency location of said candidate emission; recording, in said memory, said frequency location of said candidate emission as $f_a$; and determining, based on said frequency location $f_a$, said existence of said harmonic $h_b$ at said frequency location $f_b = f_a * k_b / k_a$; if said existence of said harmonic $h_c$ is not determined.

* * * * *